United States Patent [19]
Gomez

[11] Patent Number: 5,489,852
[45] Date of Patent: Feb. 6, 1996

[54] SYSTEM FOR INTERFACING WAFER SORT PROBER APPARATUS AND PACKAGED IC HANDLER APPARATUS TO A COMMON TEST COMPUTER

[75] Inventor: Carlos A. Gomez, Austin, Tex.

[73] Assignee: Advanced Micro Devices, Inc., Austin, Tex.

[21] Appl. No.: 973,089

[22] Filed: Nov. 6, 1992

[51] Int. Cl.$^6$ .................................................. G01R 31/28
[52] U.S. Cl. ...................... 324/754; 324/158.1; 324/765
[58] Field of Search ................... 324/158 P, 158 F, 324/72.5, 760, 754, 755, 765, 158.1; 439/482, 824; 437/8

[56] References Cited

U.S. PATENT DOCUMENTS

| | | | |
|---|---|---|---|
| 4,517,512 | 5/1985 | Petich et al. | 324/158 F |
| 4,542,341 | 9/1985 | Santomango et al. | 324/760 |
| 4,668,041 | 5/1987 | La Komski et al. | 324/158 F |
| 4,733,172 | 3/1988 | Smolley | 324/158 F |
| 4,757,256 | 7/1988 | Whann et al. | 324/758 |
| 4,928,061 | 5/1990 | Dampier et al. | 324/158 F |
| 5,081,415 | 1/1992 | Liu et al. | 324/158 F |
| 5,101,149 | 3/1992 | Adams et al. | 324/158 F |

*Primary Examiner*—Vinh P. Nguyen
*Attorney, Agent, or Firm*—Skjerven, Morrill, MacPherson, Franklin & Friel; Stephen A. Terrile

[57] ABSTRACT

A system for interfacing wafer sort prober apparatus and packaged IC handler apparatus to a common test computer is provided that includes a single motherboard and at least one daughter board. The motherboard includes a probe card interface area having a plurality of contactors that mate with symmetrical connectors provided on a probe card. The probe card includes a series of contact probes adapted to make electrical connection to a semiconductor wafer. The motherboard also includes a hole in its center to allow visual inspection and alignment of the wafer when it is positioned beneath the motherboard. A test head interface area is also provided on the motherboard and includes a plurality of contactors that mate with symmetrical contactors provided on a test head assembly of the test computer. The motherboard further includes a daughter board interface area having a plurality of contactors that mate with symmetrical contactors provided on each daughter board. A connector is provided on each daughter board that mates with an IC contactor unit. As a result, a common interface board can be used during both wafer sort testing and packaged IC testing. Cost is thereby reduced since entirely separate boards are not required. The motherboard incorporates interconnecting lines and support interface circuitry common to both wafer sort and packaged IC testing. In addition, by using a packaged IC standard unit (that is, an IC that is known to be completely functional), debugging of the motherboard interconnecting lines and support circuitry for the wafer sort configuration is simplified. Debugging of the wafer sort configuration is simplified since the daughter board can be attached directly to the motherboard independent of a prober apparatus, and thus mechanical access to the motherboard is not obstructed.

32 Claims, 13 Drawing Sheets

SYSTEM FOR INTERFACING WAFER SORT PROBER APPARATUS AND PACKAGED IC HANDLER APPARATUS TO A COMMON TEST COMPUTER

BACKGROUND OF THE INVENTION

1. Field of the Invention

This invention relates to the testing of integrated circuits and, more particularly, to the testing of integrated circuits for wafer sort operations and for functionality test operations following IC packaging.

2. Description of the Relevant Art

The fabrication of integrated circuit dies on semiconductor wafers requires many sophisticated processes. The actual number of processing steps required varies upon the type and complexity of the circuit being built.

After fabrication, the dies of each wafer are separated into individual chips for mounting and connection in a package. The mounting and connecting (bonding) steps are expensive and can approach or exceed the cost of fabrication. Despite various efforts to improve circuit yield, a major reality of semiconductor circuit manufacturing is a sizable percentage of nonfunctioning circuit dies on each wafer. Thus, to avoid wasteful packaging, a test to identify nonfunctioning chips is performed during an operation known as wafer sort (also known as die sort or electrical test). FIG. 1A is a cross-sectional view of a generalized wafer sort system. To perform the test, a wafer 10 is positioned in a wafer sort prober apparatus 12 such that the bonding pads of a particular die are contacted by a series of metal probes 13. During contact by the probes, the die is electrically tested for DC parameters and functionality. The actual electrical testing is directed by a computer 14 connected to the wafer sort prober apparatus 12 and may take from one second to over several seconds. After the test of a die is completed, the wafer sort prober apparatus 12 automatically repositions the wafer such that the pads of another die can be contacted by the metal probes 13 for identical electrical testing. Nonfunctioning or out-of-spec circuits are automatically marked during the procedure with a drop of ink by the wafer sort prober apparatus 12. FIG. 1B is a topological drawing that illustrates the wafer 10 before 10A, during 10B, and after 10C the wafer sort operation.

At the conclusion of the fabrication process and the wafer sort operation, the functioning dies 10D (those not marked with ink) are cut from the wafer and are still vulnerable to contamination and devoid of electrical connectors. Thus, before the chips can be incorporated in a computer or other electrical circuit, the chip must be mounted in a package and connected to the "outside" world via package connections. Typical packages include plastic dual in-line packages (PDIP) and plastic leaded chip carrier (PLCC) packages. FIG. 1C is a perspective view of a plastic dual in-line packaged IC 15 and FIG. 1D is a perspective view of a plastic lead chip carrier packaged IC 16.

Following packaging, another test is performed upon the integrated circuit. This test may include verification of tests performed previously during wafer sort, as well as more exhaustive functional testing, such as testing of the IC under hot and cold temperature conditions.

Referring next to FIG. 2, a typical wafer sort hardware configuration is illustrated that includes the Teradyne A500 or A520 mixed signal test system 20, a sort probe interface board (PIB) 30, an Electroglas 2001X prober apparatus 40, and a probe card 50. The sort probe interface board 30 is mechanically connectable to prober apparatus 40 by way of bolts and provides customized connections between the probe card 50 and the test system 20. When the system is setup in its operational configuration, both the probe interface board 30 and the probe card 50 are positioned on prober apparatus 40. As will be described in greater detail below, test system 20 includes a test head that can be latched and secured against a top side of probe interface board 30. The probe card 50 is positioned in prober apparatus 40 to contact the bottom side of the probe interface board 30 such that the probe interface board 30 is sandwiched between the test head and the probe card 50. The other side of probe card 50 includes a series of probes that make electrical contact with the wafer 10. The wafer 10 is precisely positioned in its testing location by prober apparatus 40. A plurality of additional wafers are positioned within a cassette unit of prober apparatus 40 to await similar positioning and testing. During subsequent tests, the prober apparatus 40 automatically removes each wafer from the cassette and precisely positions it beneath the probe card 50 such that the series of probes contact a particular dye on the wafer. The prober apparatus 40 is initially calibrated by means of a microscope 41 that facilitates visual inspection and alignment of the wafer. It is noted that probe interface board 30 includes a hole in its center to accommodate this visual access through the system to the wafer 10.

FIG. 3 is an expanded view of the Teradyne A520 mixed signal test system 20. The test system includes a mainframe portion having a mixed signal cabinet 21, an analog cabinet 22, and test and user computers supplied by Sun Microsystems, Inc. The test system 20 further includes a terminal and monitor combination 23, a power supply vault 24, and a test head assembly (shown in FIG. 4). The mixed signal cabinet 21 contains the digital subsystems and a mixed signal test head interface. The analog cabinet 22 contains the analog subsystems, the analog test head interface and a test computer. The A520 test system 20 provides primary control over a large variety of test operations to perform both wafer sort and packaged IC tests.

FIG. 4 is a perspective view of a test head assembly integrated with the A520 test system 20. The mainframe of the test system 20 is connected to the test head assembly through multiple cables which originate on the operator side of the mainframe. The test head assembly includes a test head 25 mounted to a stand 26 that is movable upon a set of rollers 29. The test head 25 is mounted on an arm of stand 26 and can be rotated in a counterclockwise direction "a" or in a clockwise direction "b". The test head 25 provides an interface between the probe interface board 30 (FIG. 2) and the mainframe of the A500 test system 20. Test head 25 is rotatable upon stand 26 to accommodate mechanical connection to prober apparatus 40 (FIG. 2) as well as to various IC handler apparatus, as will be described further below.

FIG. 5 is an expanded block diagram of test head 25 of the test head assembly. The test head 25 includes linking circuitry to maintain the integrity and fidelity of signals propagating to and from the device under test (e.g., wafer 10). Both analog and digital channel electronics are provided to carry low-distortion analog signals and high-frequency digital signals from the test system 20 to the device under test. The test head 25 includes a base 26 that houses a test head card cage 26A and a plurality of test head channel cards 26B. The channel cards 26B plug into the test head card cage 26A and supply the local electronics required to interface to the device under test. A channel card interface board 27 and a connector board 28 provide an interface between the device under test and the channel cards 26B in the station base 26.

Connector board 28 is a printed circuit board that is connected to the channel card interface board 27 via coaxial cables 28B. The top side of connector board 28 includes a ring of spring-loaded contact pins 28A, also referred to as ISO-pins or POGO-pins, that contact and make electrical connections to an interface board 30A (such as probe interface board 30 or a device interface board described below).

FIG. 6 illustrates an expanded view of the probe interface board 30. The probe interface board 30 includes a metal frame 31 that provides mechanical support and mounting for a printed circuit board 32. As explained previously, a center portion 33 is cut out or left open to allow visual inspection and alignment of a semiconductor wafer that will be positioned beneath the board in the prober apparatus 40. The printed circuit board 32 provides customized connections between the A520 test head assembly and the probe card 50 (FIG. 2). The specific layout of printed circuit board 32, as well as associated electrical components such as relays and capacitors connected thereto, are customized by the user for proper adaptation to the specific integrated circuits that are to be tested. The printed circuit board 32 includes a test head interface area 34 as well as a probe card interface area 35 each extending circumferentially around opposite surfaces of the printed circuit board 32. The test head interface area 34 includes a series of contact pads formed on the printed circuit board 32 that mate with the spring-loaded contact pins 28A of the board 28 incorporated within the test head 25 (FIG. 5). The probe card interface area 35 contains a similar series of contact pads that mate with spring-loaded contact pins on probe card 50, as will be described further below.

FIG. 7 is a bottom-side view of probe card 50. Probe card 50 includes a plurality of interconnect lines 51 formed on and extending from a printed circuit board 52. The interconnect lines 51 extend radially from a center contact portion where electrical contact can be made to the pads of a die on a semiconductor wafer. The topside of probe card 50 (not shown) includes a plurality of spring-loaded contact pins that mate with the circumferential contact pads of the probe card interface area 35 of probe interface board 30 (FIG. 6). During a wafer sort operation, the probe card 50 is positioned within prober apparatus 40 (FIG. 2) and provides an electrical pathway between the probe interface board 30 and the wafer 10.

From the foregoing descriptions of FIGS. 2–7, it is evident that an electrical pathway and interface is established between the semiconductor wafer 10 and the test system 20. As a summary, the test system 20 includes a test computer that controls primary test operations performed upon the semiconductor wafer 10. The probe interface board 30 provides a custom interface between the wafer 10 and the test system 20 and includes a hole in its center. The probe card 50 and the probe interface board 30 are both positioned on the prober apparatus 40 such that the spring-loaded contactor pins of probe card 50 make electrical connections to the probe card interface area 35 of probe interface board 30. The prober apparatus 40 includes a microscope 41 to view the wafer 10 through the center hole portions of the sort probe interface board 30 and the probe card 50 to allow visual inspection and alignment of the wafer 10. The test head assembly is then latched to the probe interface board 30 to complete the test set-up. After the prober apparatus 40 has been calibrated, subsequent dies and wafers are automatically positioned by prober apparatus 40 for contact with probe card 50. Following each sort operation, non-functional dies are marked with ink by an inking device incorporated on prober apparatus 40.

The testing of integrated circuits after packaging will next be considered. FIG. 8 illustrates a typical hardware configuration for testing PDIP packaged integrated circuits. The system includes a Teradyne A500 or A520 test system (same as that described above), a device interface board (DIB) 60, a docking plate 70, a packaged IC handler apparatus 75, a second packaged IC handler apparatus 80, an IC contactor unit 85, and a second IC contactor unit 90. Handler apparatus 75 is a hot and room temperature handler manufactured by Micro Component Technology, Inc. (MCT), St. Paul, MN, Model No. 3616E. The associated IC contactor 85 is an elevated and ambient temperature contactor also manufactured by MCT, Model No. 116142. The handler apparatus 80 is a cold and room temperature handler, MCT Model No. 3608C, and IC contactor 90 is a cold and ambient temperature contactor, MCT Model No. 945384. Each of these components will be better understood from the following description.

FIG. 9 illustrates a bottom view of device interface board 60. The device interface board 60 is similar to the probe interface board 30 in that it provides an interface to the test head assembly of test system 20. The topside (not shown) of device interface board 60 includes a metal frame that provides mechanical support for the main body of the device interface board 60. The main body of the device interface board 60 is composed of a printed circuit board 62 that provides customized connections between the A520 test head assembly and an IC contactor unit 85 or 90. The specific layout of the printed circuit board 62 as well as the electrical components connected thereto are customized by the user for proper adaptation to the specific integrated circuits that are to be tested. The printed circuit board 62 includes a test head interface area 64 that includes a series of contact pads formed circumferentially around the surface of the printed circuit board 62. These contact pads are formed to mate with the spring-loaded contact pins 28A of the connector board 28 incorporated within the test head 25 (FIG. 5). A female connector 65 is provided near the center of the device interface board 60 on its opposite side to provide a connecting mate for either the IC contactor 85 or IC contactor unit 90. It is noted that the device interface board 60 does not have a hole in its center.

FIG. 10 illustrates a perspective view of an IC contactor unit 86 representative of IC contactors 85 and 90. IC contactor unit 86 includes an IC receiving port 87 that receives a packaged integrated circuit. A plurality of pins 88 of the IC contactor unit 86 individually contact the pins of the integrated circuit. The other side (not shown) of the IC contactor unit 86 includes a plurality of male connector pins that mate to the female connector 65 of the device interface board 60.

Referring back to FIG. 8, IC contactors 85 and 90 are bolted to a rear portion of the handlers 75 and 80, respectively. The docking plate 70 is also bolted to a rear portion of the handler 75 or 80 such that the male connecting pins of the respective IC contactor 85 or 90 are exposed through a center hole of the docking plate 70. The device interface board 60 can then be bolted to the docking plate 70 such that the male connector pins of the IC contactor 85 or 90 are received by the female connector 65 of device interface board 60. Setup of the hardware configuration is completed by latching the test head of the A520 test system to the device interface board 60. Upon completion of the setup, packaged IC testing can be initiated. It is noted that handler apparatus 75 and 80 are provided to automatically position individual packaged integrated circuits into the contactor units 85 and 90 for automatic testing. Hundreds of packaged integrated circuits can be inserted within the respective handler apparatus at the same time and are each automatically positioned in turn within the respective IC contactor 85 or 90. Following the test of each integrated circuit, the handler apparatus 75 or 80 categorizes and separates the functioning integrated circuits from the nonfunctioning integrated circuits.

FIG. 11 shows a similar hardware configuration for testing PLCC packaged integrated circuits. The configuration of FIG. 11 is similar to that of FIG. 8 and includes a handler apparatus 91 manufactured by Aetrium, Inc., St. Paul, MN, Model No. 3100. An IC contactor 92 is provided that mounts to the rear of the handler apparatus 91 and includes a receptacle to receive PLCC packaged integrated circuits. A device interface board 93 interfaces with a rear connector portion of IC contactor 92 and the test head of test system 20.

It is not surprising that the components of the test configurations as shown in FIGS. 2–11 are extremely expensive. Each probe interface board 30 and device interface board 60 can cost several thousands of dollars alone. The probe interface board 30 is designed to accommodate the spring-loaded contact pins of the probe card 50 and must include a hole to facilitate visual inspection and alignment of the wafer. On the other hand, the device interface board 60 is designed to accommodate the male pins of the IC contactor 85 or 90 near the center of the device interface board 60. Due to these independent and conflicting design considerations, the probe interface board 30 and the device interface board 60 are quite different in design and are incompatible with one another. The semiconductor manufacturer must therefore incur the costs of both types of boards to perform both wafer sort operations and packaged IC testing.

An additional problem associated with the wafer sort hardware configuration of FIG. 2 occurs when the test configuration itself is malfunctioning due to, for example, faulty software within test system 20, faulty interface circuitry, or damaged components and interconnect lines. Since both the probe interface board 30 and the probe card 50 must be positioned within prober apparatus 40, debugging of the probe interface board 50 is difficult due to inadequate mechanical clearance for the test probes of oscilloscopes and other debugging equipment.

SUMMARY OF THE INVENTION

In accordance with the present invention, a system for interfacing wafer sort prober apparatus and packaged IC handler apparatus to a common test computer is provided that includes a single motherboard and at least one daughter board. The motherboard includes a probe card interface area having a plurality of contactors that mate with symmetrical connectors provided on a probe card. The probe card includes a series of contact probes adapted to make electrical connection to a semiconductor wafer. The motherboard also includes a hole in its center to allow visual inspection and alignment of the wafer when it is positioned beneath the motherboard. A test head interface area is also provided on the motherboard and includes a plurality of contactors that mate with symmetrical contactors provided on a test head assembly of the test computer. The motherboard further includes a daughter board interface area having a plurality of contactors that mate with symmetrical contactors provided on each daughter board. A connector is provided on each daughter board that mates with an IC contactor unit. As a result of the present invention, a common interface board can be used during both wafer sort testing and packaged IC testing. Cost is thereby reduced since entirely separate boards are not required. The motherboard incorporates interconnecting lines and support interface circuitry common to both wafer sort and packaged IC testing. In addition, by using a packaged IC standard unit (that is, an IC that is known to be completely functional), debugging of the motherboard interconnecting lines and support circuity for the wafer sort configuration is simplified. Debugging of the wafer sort configuration is simplified since the daughter board can be attached directly to the motherboard independent of a prober apparatus, and thus mechanical access to the motherboard is not obstructed.

These and other advantages are achieved with the present invention, in accordance with which a system is provided for interfacing a wafer sort prober apparatus and a packaged IC handler apparatus to a common test computer. The wafer sort prober apparatus provides electrical connections to a semiconductor wafer, and the packaged IC handler apparatus provides electrical connections to a packaged integrated circuit. Furthermore, the common test computer controls test operations performed upon the semiconductor wafer and packaged integrated circuit. The system comprises a mother interface board including a computer system interface area, a prober apparatus interface area, and a daughter board interface area. The computer system interface area includes a plurality of contactors for providing electrical connections to the test computer. The prober apparatus interface area includes a plurality of contactors for providing electrical connections to the wafer sort prober apparatus. The system further comprises a daughter board including a plurality of contactors that mate with a plurality of contactors included with the daughter board interface area of the mother interface board. The daughter board also includes a connector portion that mates with the packaged IC handler apparatus.

The invention will be more readily understood with reference to the drawings and the detailed description. As will be appreciated by one skilled in the art, the invention is applicable to wafer sort and packaged IC test configurations in general and is not limited to the specific embodiment disclosed.

DESCRIPTION

The following includes a detailed description of the best presently contemplated mode for carrying out the invention. The description is intended to be merely illustrative of the invention and should not be taken a limiting sense.

Figure 12:
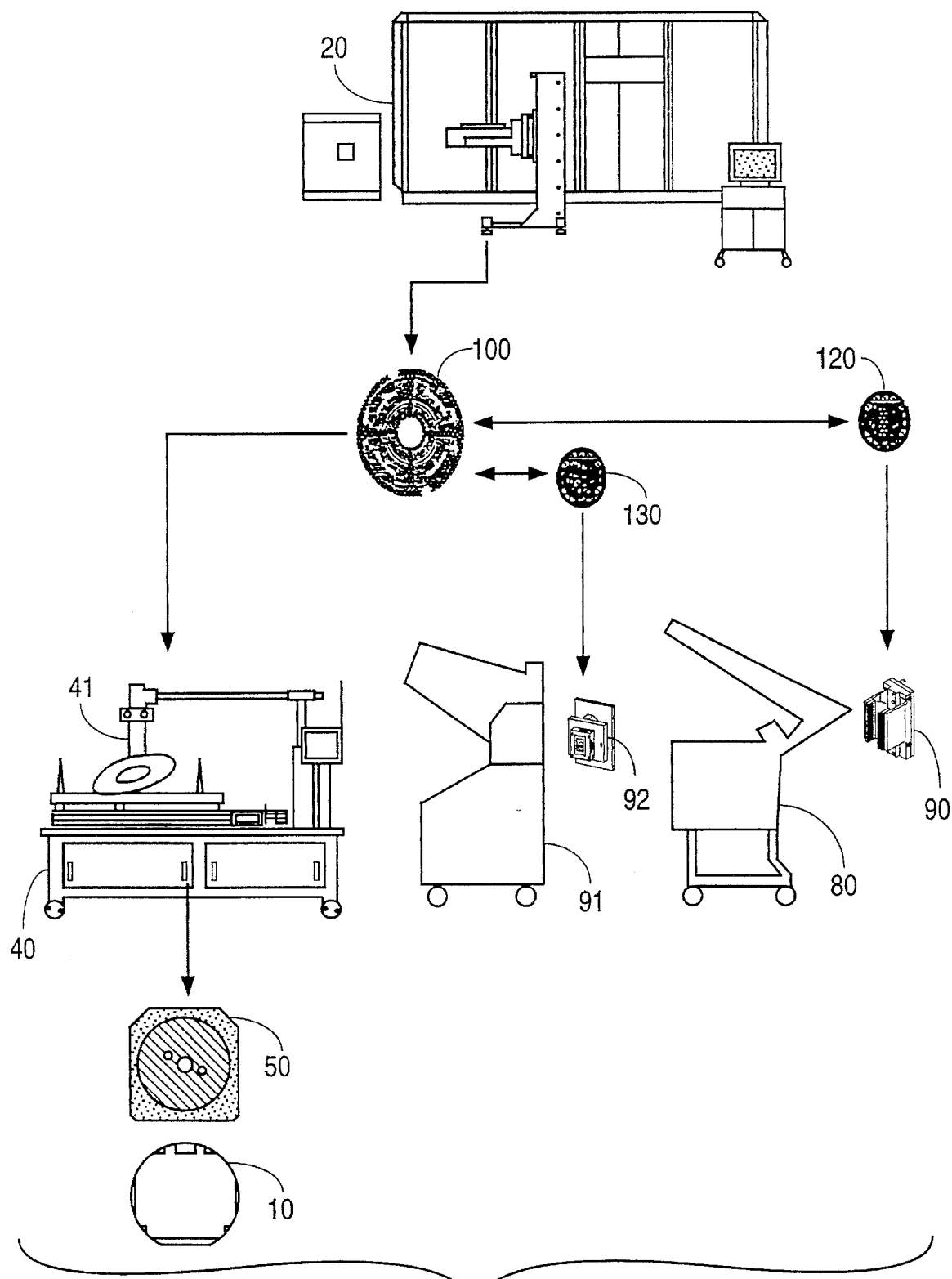
FIG. 12 is a diagram of a wafer sort and packaged IC test configuration in accordance with the present invention.

Referring to FIG. 12, a wafer sort and packaged IC test configuration is shown in accordance with the present invention. In this embodiment, the test configuration includes a Teradyne A500 or A520 test system 20, an Electroglas 2001X prober apparatus 40, a probe card 50, an MCT Model 3608C handler apparatus 80, an Aetrium Model 3100 handler apparatus 91, and IC contactor units 90 and 92. Each of these components have been described above and their operation is similar in this configuration.

In accordance with the invention, the test configuration is further provided with a mother interface board 100, and attachable daughter boards 120 and 130. The mother interface board 100 is adapted to interface between the test head of test system 20 and a probe card 50, and includes a center hole that accommodates visual access to the wafer 10 via microscope 41 for alignment and inspection of the wafer. Daughter boards 120 and 130 mate with mother interface board 100 and provide appropriate connectors for attachment to IC contactor units such as IC contactor 90 and IC contactor 92. This will be better understood from the following.

Figure 5:
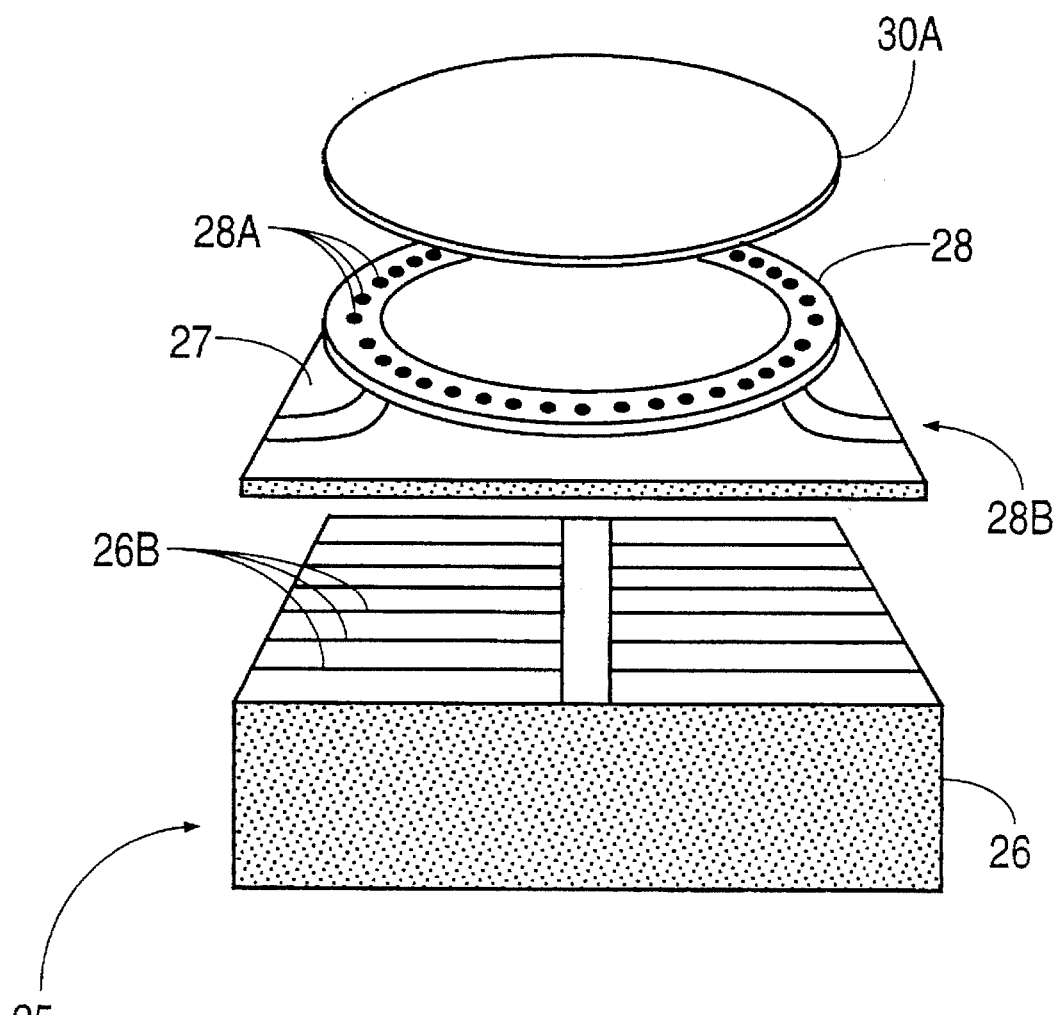
FIG. 5 is an expanded block diagram of the test head assembly.
Figure 6:
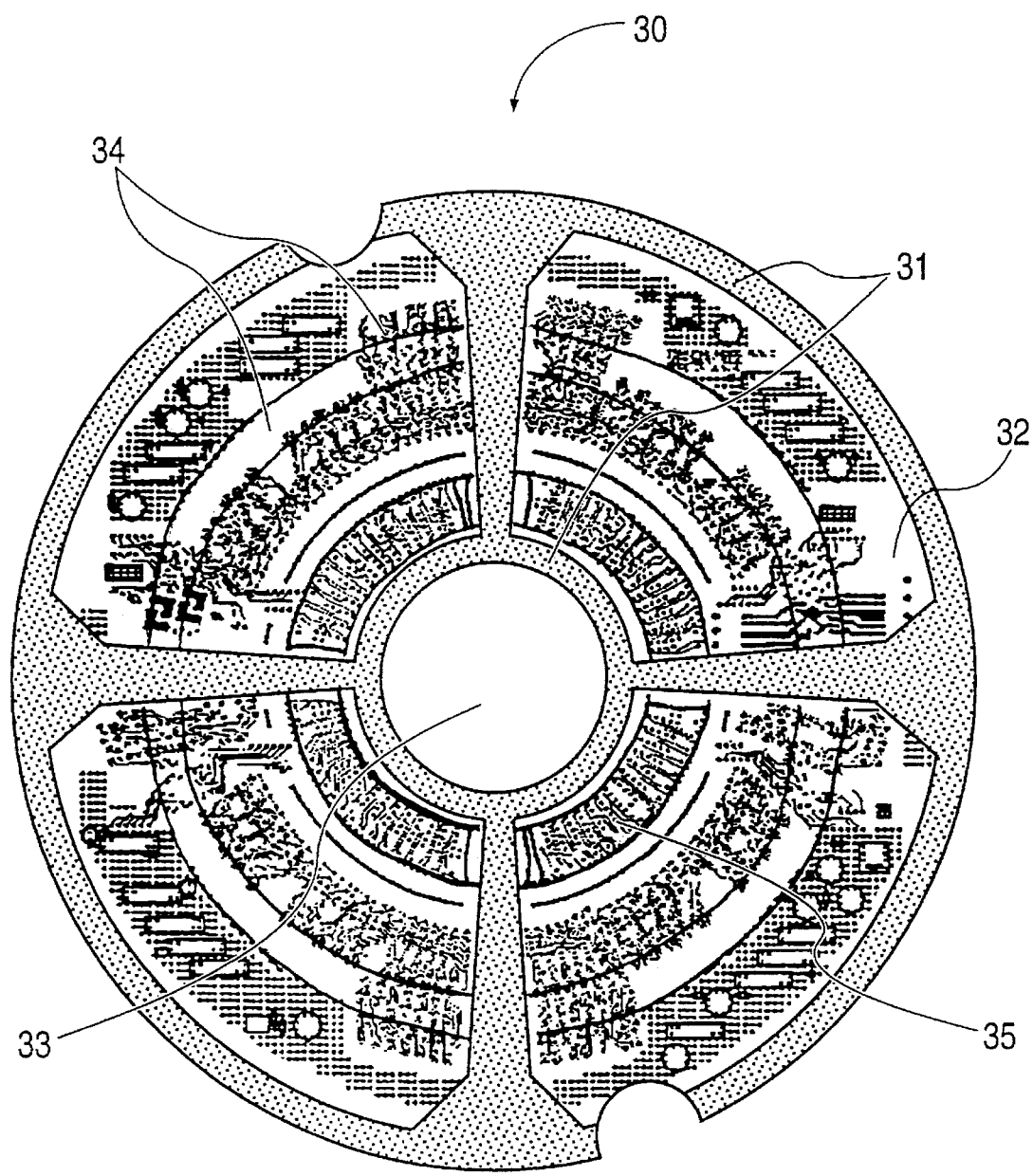
FIG. 6 is a diagram illustrating an expanded view of a sort probe interface board.
Figure 7:
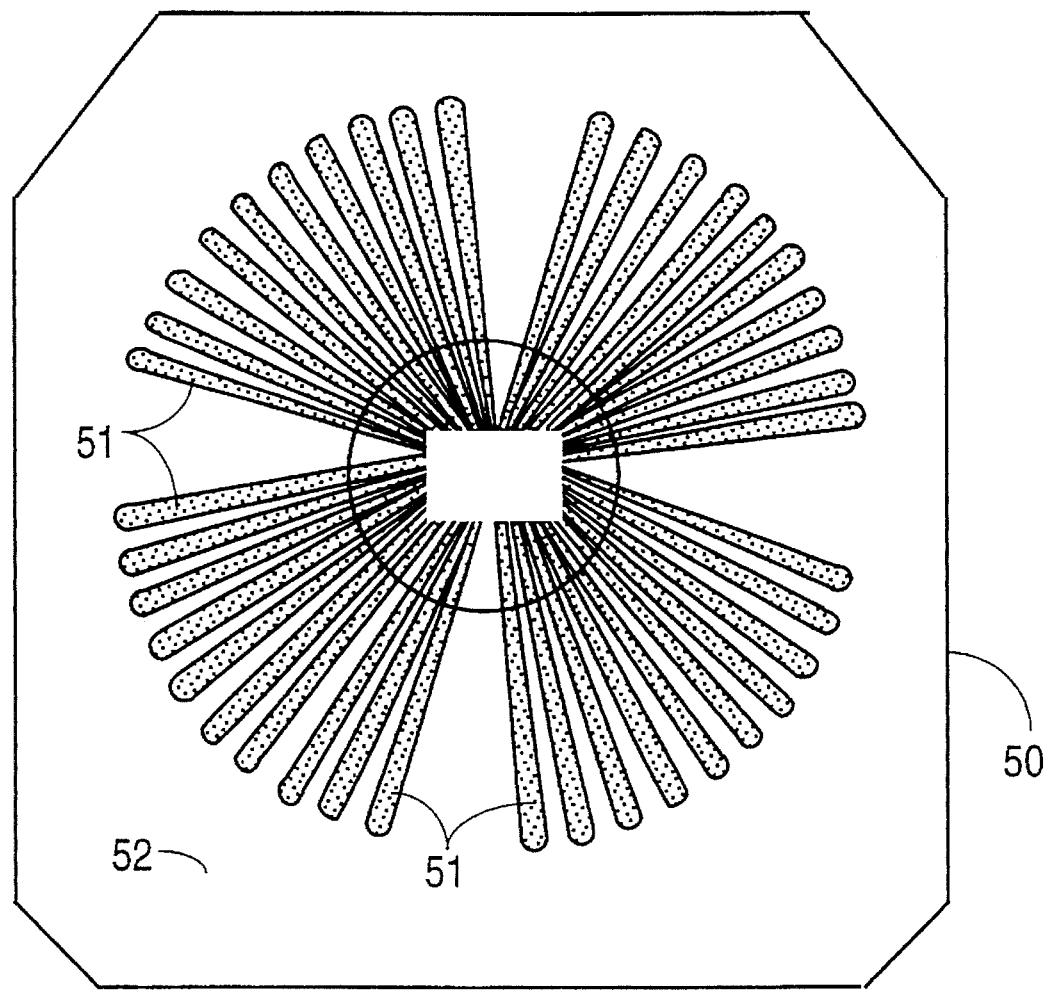
FIG. 7 is a diagram illustrating a bottom-side view of a probe card.
Figure 8:
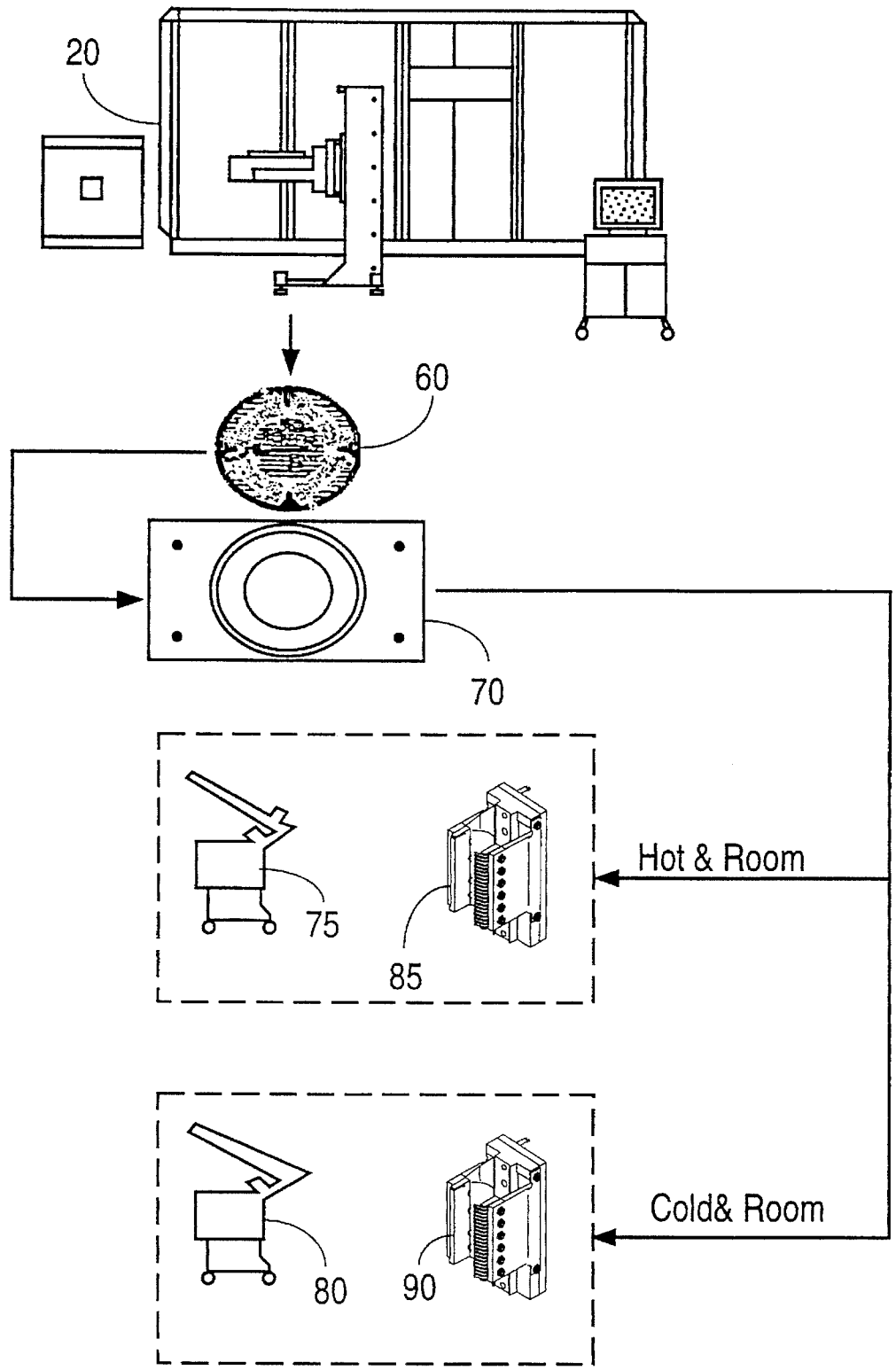
FIG. 8 is a diagram that illustrates a typical hardware configuration for testing PDIP packaged integrated circuits.
Figure 9:
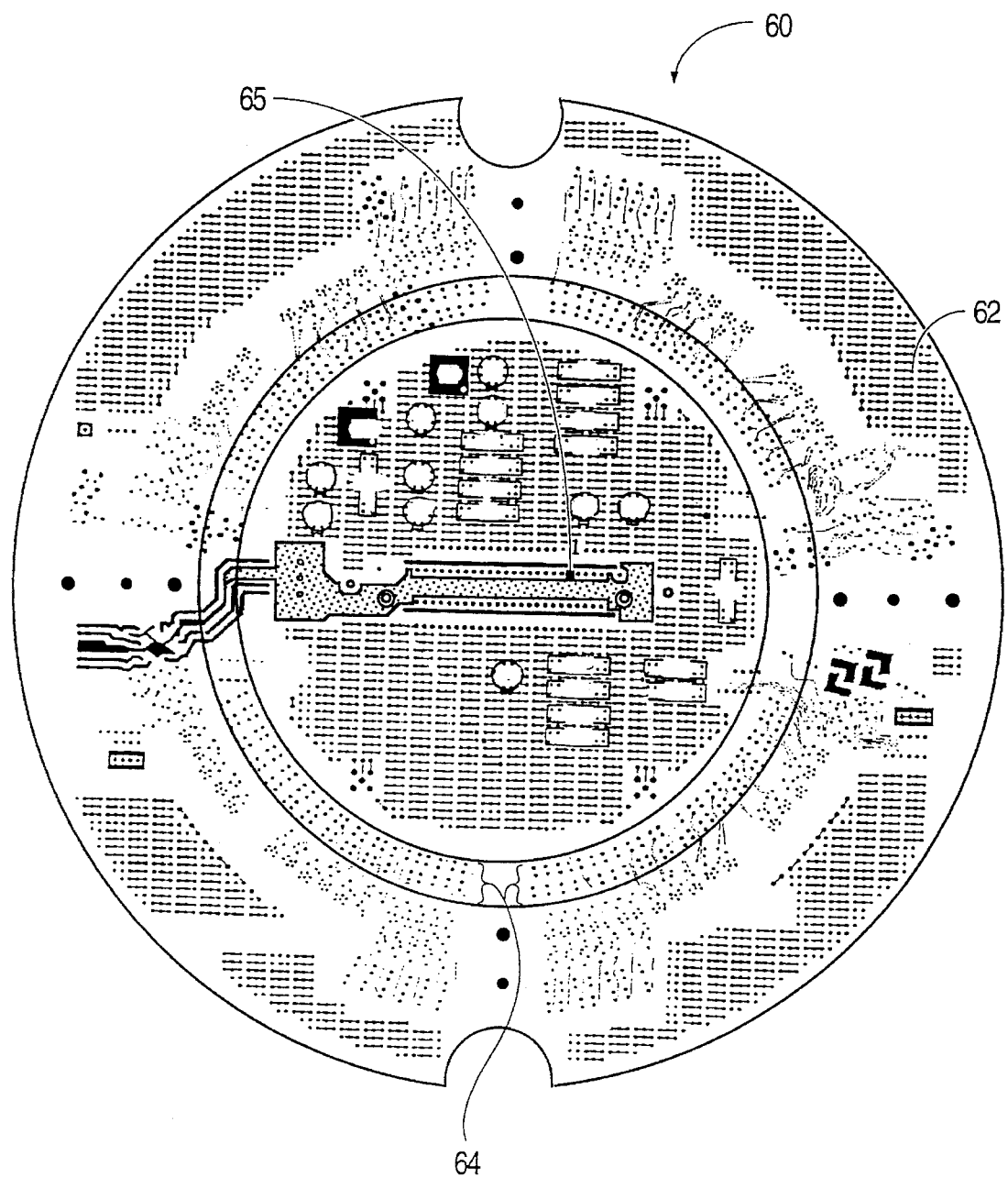
FIG. 9 is a diagram that illustrates a bottom view of a device interface board.
Figure 10:
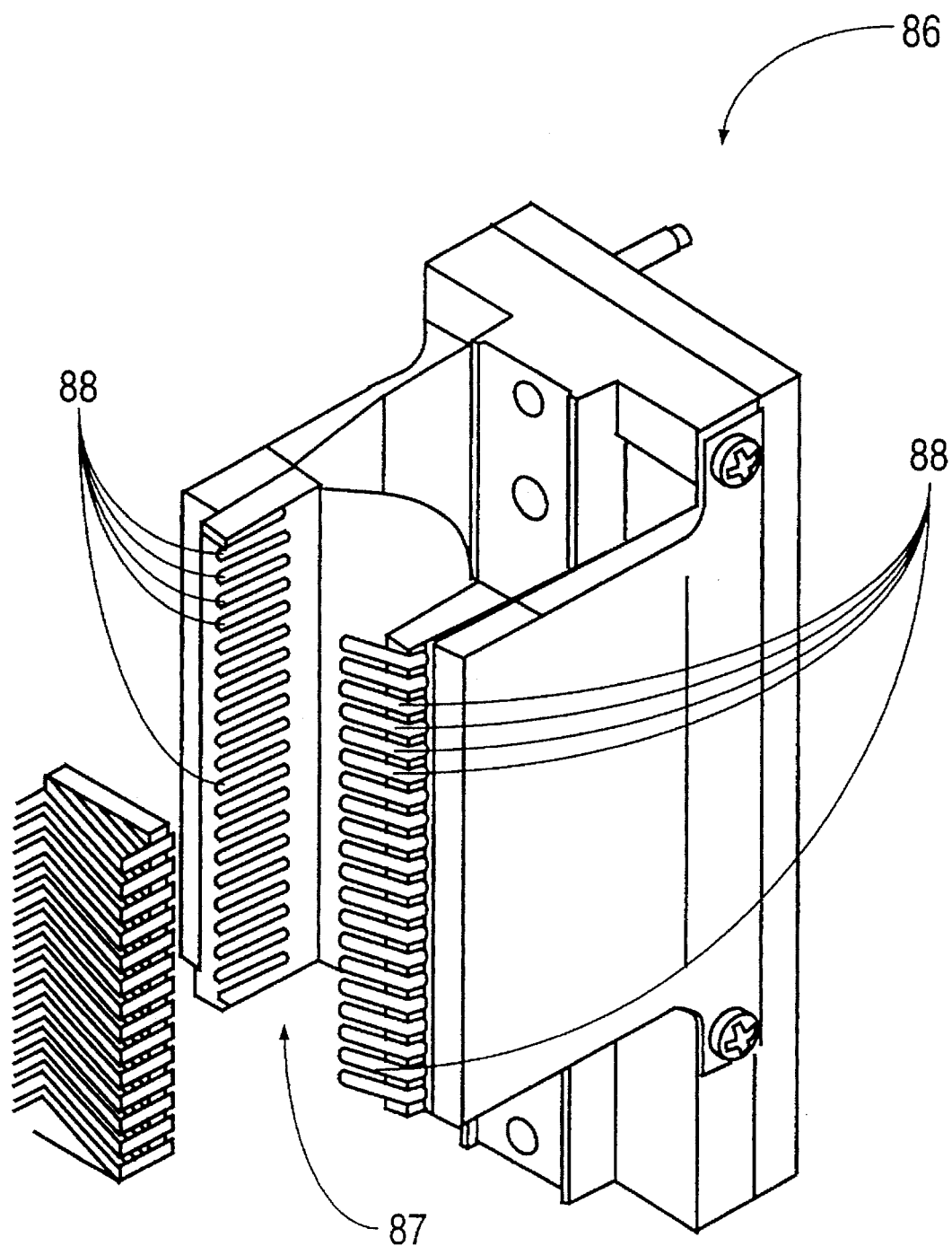
FIG. 10 is a diagram that illustrates a perspective view of an IC contactor unit.
Figure 11:
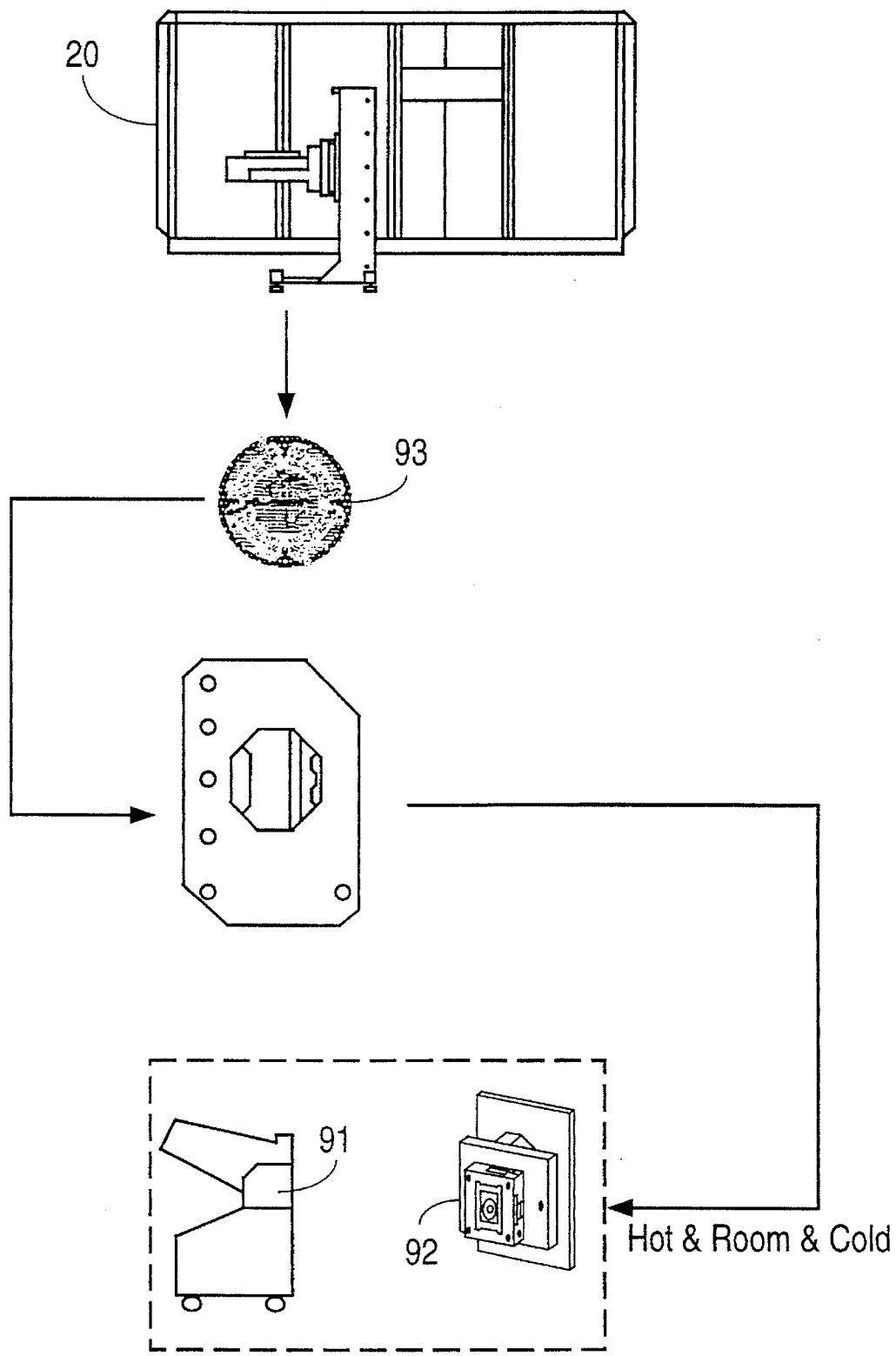
FIG. 11 is a diagram of a hardware configuration for testing PLCC packaged integrated circuits.
Figure 13:
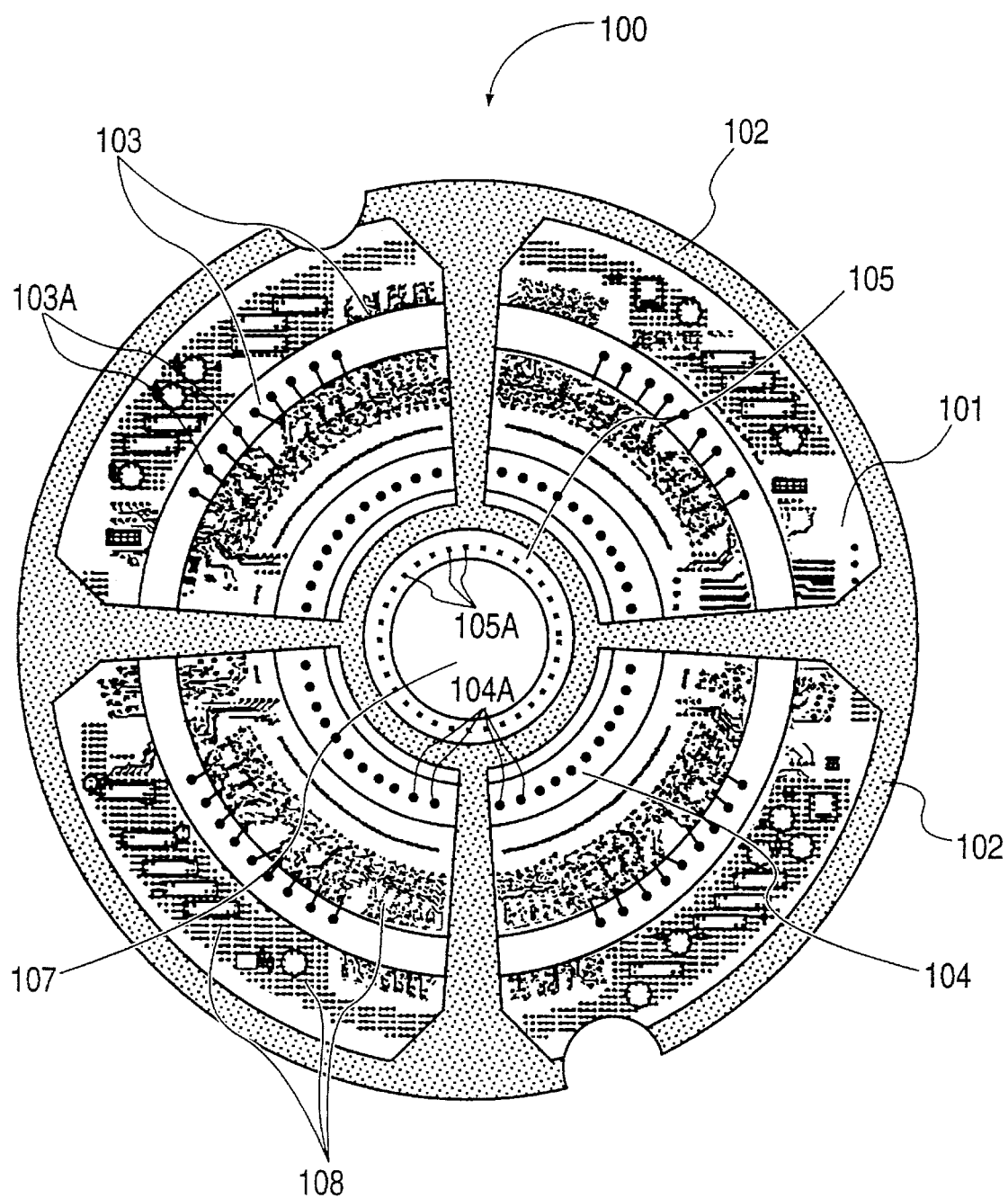
FIG. 13 is a diagram that illustrates a mother interface board in accordance with the present invention.

FIG. 13 illustrates a mother interface board 100 in accordance with the present invention. The mother interface board includes a printed circuit board 101 that is mounted to a metal frame 102. The printed circuit board 101 includes a test head interface area 103 and a probe card interface area 104 each extending circumferentially around opposite sides of the printed circuit board 101. The probe card interface area 104 includes a series of contact pads 104A formed on the printed circuit board 101 that mate with the spring-loaded contact pins of probe card 50. Similarly, the test head interface area 103 includes a series of contact pads 103A formed on the other side of printed circuit board 101 that mate with the spring-loaded contact pins 28A of the test head of test system 20 (see FIG. 5). Mother interface board 100 further includes a daughter board interface area 105 having a series of circumferentially spaced female connectors 105A that mate to daughter boards 120 and 130. In the embodiment disclosed, connectors 105A are female receptacles that mate to corresponding, circumferentially-arranged, male pins on daughter boards 120 and 130. A hole 107 is provided in the center of mother interface board 100 to allow visual access to a wafer beneath the mother interface board 100. In addition, a network of interconnect lines and support circuitry 108 are provided throughout the printed circuit board 101 of mother interface board 100.

Figure 14:
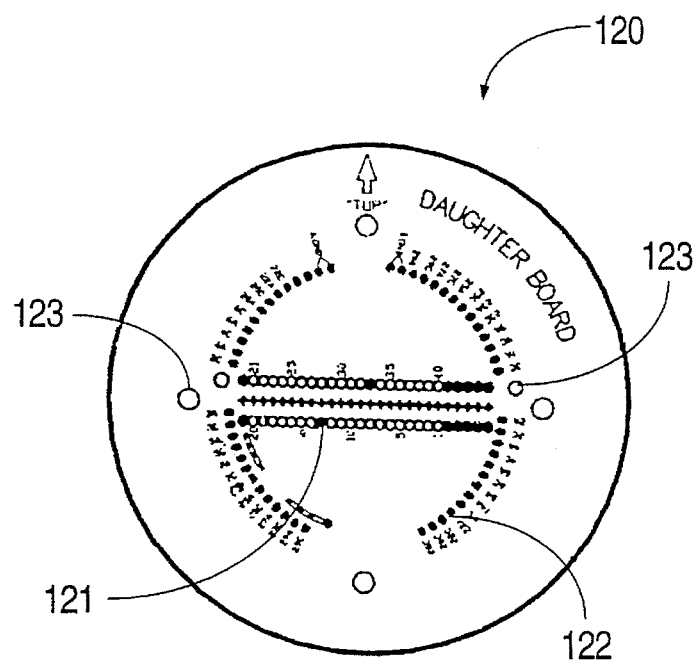
FIG. 14 is a diagram that illustrates a top view of a daughter board that interfaces with a PDIP IC contactor unit.

FIG. 14 illustrates a top view of daughter board 120. The daughter board 120 includes a series of female connectors 121 that mate with the male connectors of IC contactor unit 90. The opposite side of daughter board 120 includes a series of circumferentially-arranged male pins 122 that mate with the female receptacles 105A of the daughter board interface area 105 of mother interface board 100. A pair of guide holes 123 are further provided in daughter board 120 to receive a pair of guide pins mounted on contactor 90.

It is noted that the daughter board 120 has an outer perimeter that extends substantially beyond the perimeter formed by the daughter board interface pins 122. The diameter of daughter board 120 is oversized such that the outer perimeter of daughter board 120 extends beyond the probe card interface area 104 when connected to motherboard 100. The pads of the probe card interface area 104 are thereby covered by daughter board 120 and are protected from damage due to, for example, accidental contact with hard objects when the mother interface board 100 is being positioned and bolted to the handler apparatus 80 or 91.

Figure 15:
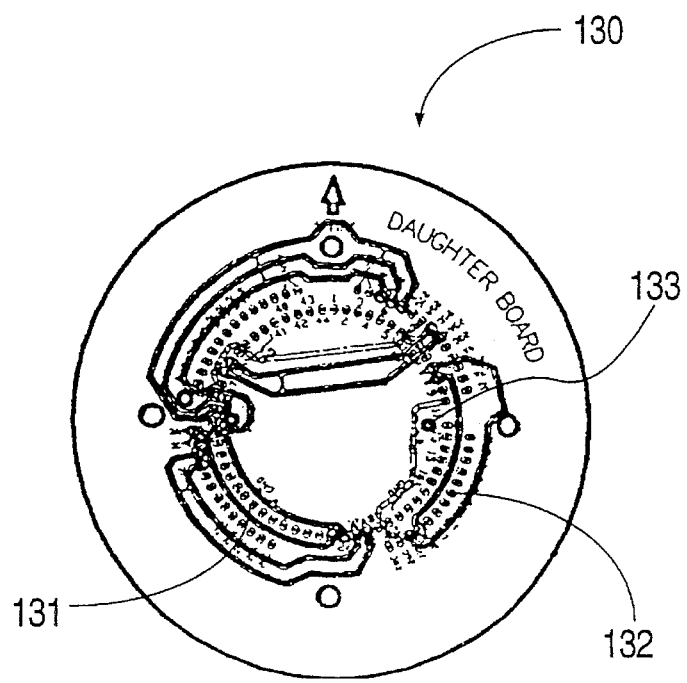
FIG. 15 is a diagram that illustrates a top view of a daughter board that interfaces with a PLCC IC contactor unit.

FIG. 15 illustrates a top view of daughter board 130. Daughter board 130 is similar to daughter board 120 but includes a series of female connectors 131 that mate with IC contactor 92 rather than to IC contactor 90. Daughter board 130 also includes a set of daughter board interface pins 132 which are circumferentially-arranged male pins 132. Pins 132 are identical to those of daughter and mate with the female receptacles 105A on mother interface board 100 to interface daughter board 130 with mother interface board 100. Guide holes 133 are also provided on daughter board 130.

A test configuration in accordance with the present invention advantageously provides a mother interface board 100 that can be used during both wafer sort testing and packaged IC testing. Cost is thereby reduced since entirely separate boards are not required and redundant circuitry is eliminated.

Figure 1A:
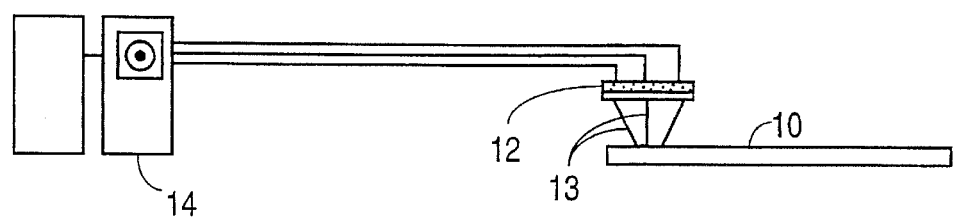
FIG. 1A is a cross-sectional view of a generalized wafer sort system.
Figure 1B:
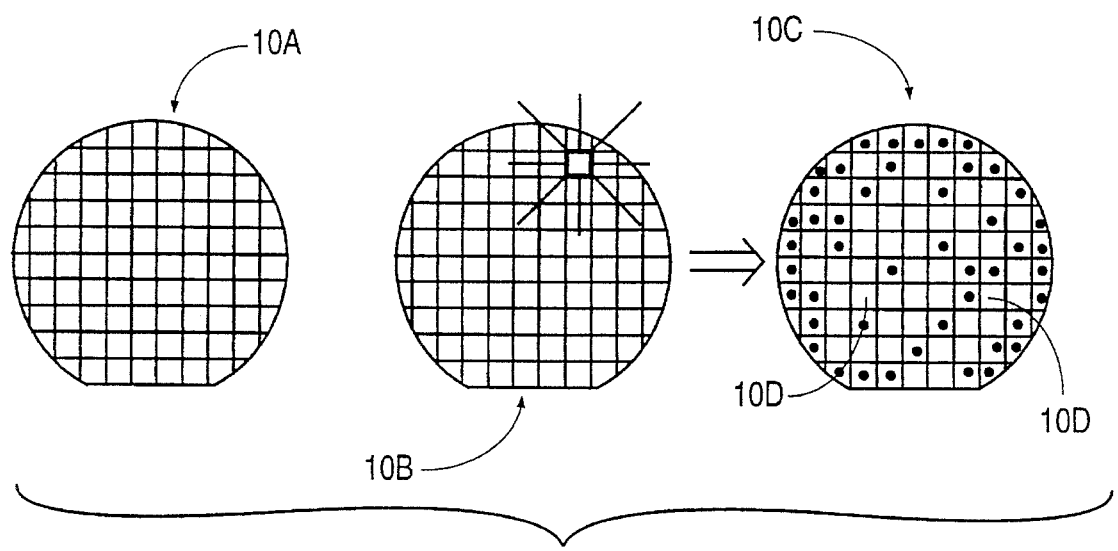
FIG. 1B is a topological drawing that illustrates a semiconductor wafer before, during, and after a wafer sort operation.
Figure 1C:
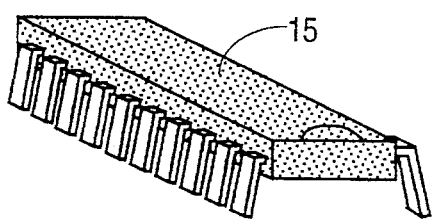
FIG. 1C is a perspective view of a plastic dual inline packaged IC.
Figure 1D:
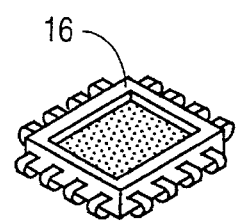
FIG. 1D is a perspective view of a plastic lead chip carrier packaged IC.
Figure 2:
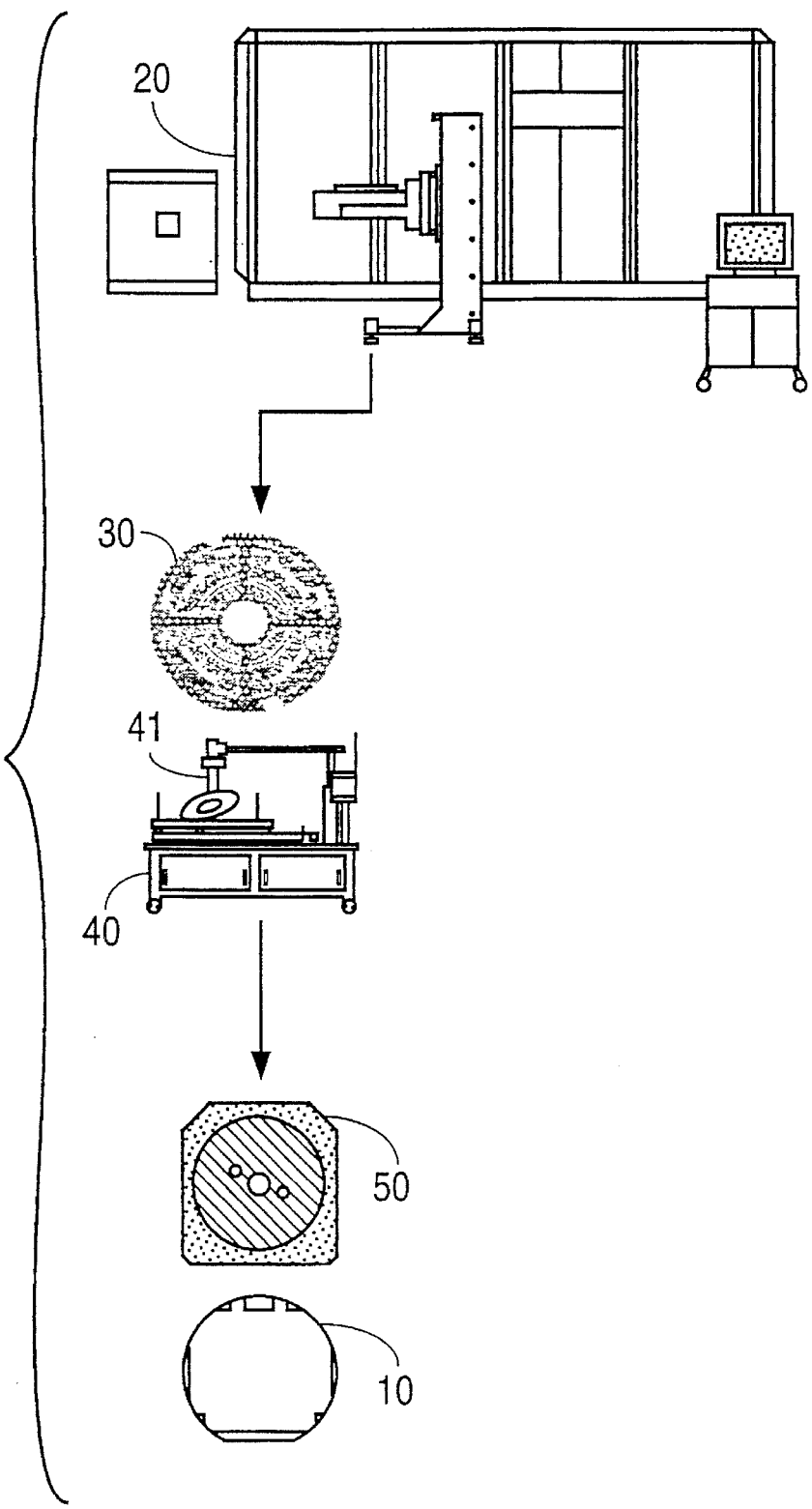
FIG. 2 is a diagram illustrating a typical wafer sort hardware configuration.
Figure 3:
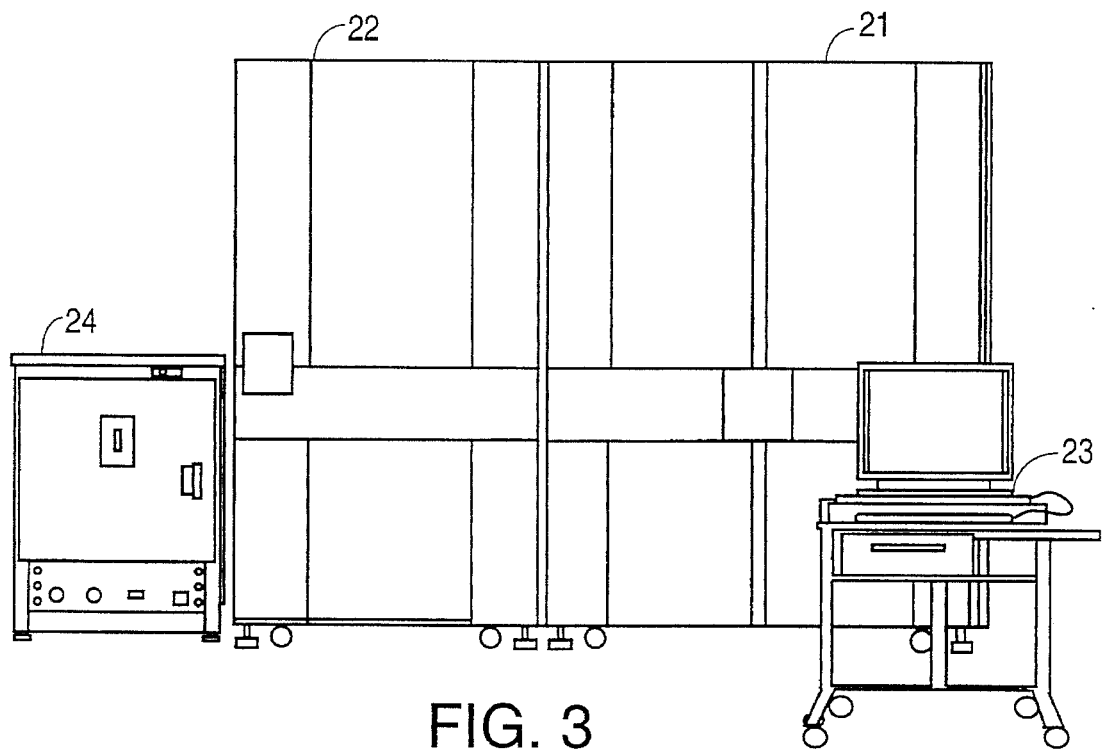
FIG. 3 is an expanded view of a computer system for controlling wafer sort and packaged IC test operations.
Figure 4:
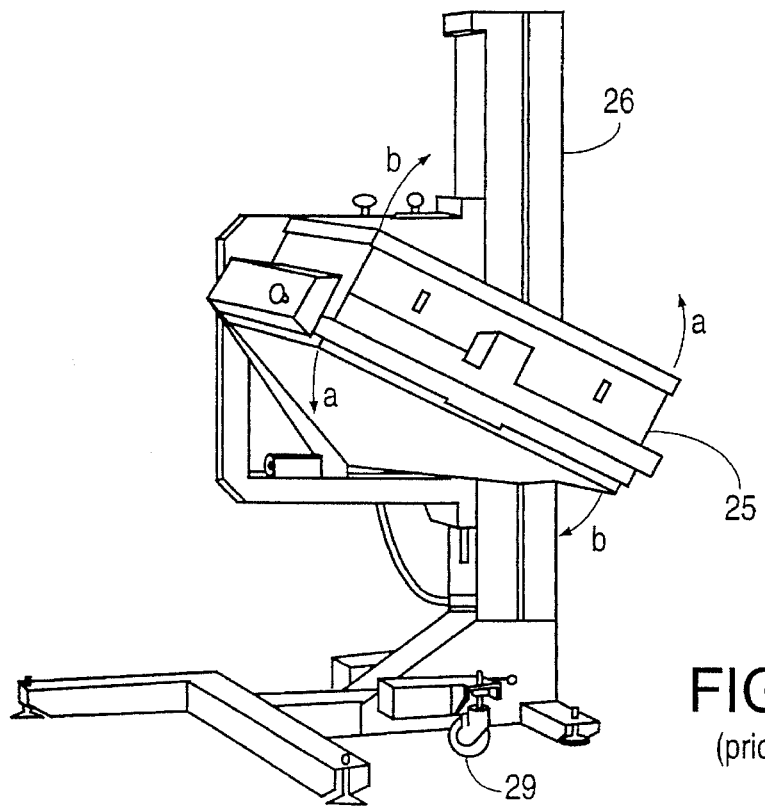
FIG. 4 is a perspective view of a test head assembly integrated with the computer system.

In addition, since the daughter boards 120 and 130 can be attached to mother interface board 100 independent of a prober apparatus 40, debugging of the wafer sort configuration is simplified since ample access to the mother interface board 100 is accommodated. For example, consider the case where the mother interface board 100 has been damaged. To locate the source of the problem, a packaged IC standard that is known to be fully operational can be inserted within IC contactor unit 92. IC contactor 92 can then be plugged into daughter board 130 which is correspondingly plugged into mother interface board 100. The mother interface board 100 can then be latched to the test head of test system 20 and an entire side of mother interface board 100 is left exposed such that adequate mechanical access can be obtained for debugging tools such as oscilloscopes and other test equipment. The interface circuitry on mother interface board 100 that is used in both the wafer sort configuration and the packaged IC testing configuration can thereby be debugged. It is noted that for the wafer sort configuration of FIG. 2, debugging of the probe interface board 30 is difficult since both sides of the probe interface board 30 are substantially covered by prober apparatus 40 and the test head of test system 20.

It is also noted that although the embodiment described above is implemented using a specific test system 20, a specific prober apparatus 41, and specific handler apparatus 80 and 91, other similar units may be substituted without departing from the spirit and scope of the present invention. For example, although test system 20 includes a test head assembly as described that provides connections between mother interface board 100 and the mainframe of test system 20, a connector making direct electrical connections between the mother interface board 100 and a test computer system may be used. Similarly, a variety of other wafer prober apparatus and packaged IC handler apparatus may be used to interface to the mother interface board 100 and daughter boards 120 and 130.

In addition, although the daughter board interface area 105 and the daughter board interface pins 122 of the above embodiment are implemented using mating male-female connectors, other types of electrical contactors may be used. To provide the simplified debugging capability as described above however, the contactors between the daughter board and the mother interface board must include a means that attaches the daughter board to the mother interface board independently of the prober apparatus 40.

Numerous modifications and variations will become apparent to those skilled in the art once the above disclosure is fully appreciated. It is to be understood that the above detailed description of the preferred embodiment is intended to be merely illustrative of the spirit and scope of the invention and should not be taken in any limiting sense. The scope of the claimed invention is better defined with reference to the following claims.

What is claimed is:

1. An apparatus for interfacing a wafer sort prober apparatus or a packaged IC handler apparatus to a common test system, wherein said wafer sort prober apparatus includes a probe card for providing electrical connections to a semiconductor wafer, and wherein said packaged IC handler apparatus includes an IC contactor for providing electrical connections to a packaged integrated circuit, and wherein said common test system includes a test head for providing electrical connections between said test system and an external device, said interfacing apparatus comprising:
   a mother interface board having first contactors to electrically contact said test head, a plurality of second contactors to electrically contact said probe card, and a plurality of third contactors; and
   a daughter board having a plurality of fourth contactors removably connected to said third contactors and a plurality of fifth contactors to electrically contact said IC contactor unit.

2. An interfacing apparatus as recited in claim 1 wherein said mother interface board includes a center-located hole that allows visual access to said semiconductor wafer when positioned beneath said mother interface board.

3. An interfacing apparatus as recited in claim 1 wherein an outer periphery of said daughter board extends beyond said second contactors such that said second contactors are covered when said daughter board is connected to said mother interface board.

4. An interfacing apparatus as recited in claim 1 wherein said third contactors are female receptacles and wherein said fourth contactors are male connecting pins that mate with said female receptacles.

5. An interfacing apparatus as recited in claim 1 wherein said mother interface board includes a printed circuit board having a plurality of contact pads that form said plurality of first contactors and said plurality of second contactors.

6. An interfacing apparatus as recited in claim 1 wherein said mother interface board includes a plurality of electronic components to support an electrical test of semiconductor wafers and of packaged integrated circuits.

7. An interfacing apparatus as recited in claim 5 wherein said first contactors are first side of said printed circuit board and wherein said second contactors are on a second side of said printed circuit board.

8. An interfacing apparatus as recited in claim 7 wherein said third contactors are on said second side of said printed circuit board.

9. An interfacing apparatus as recited in claim 1 wherein said third and fourth contactors provide for attaching said daughter board to said mother interface board independent of said wafer sort prober apparatus.

10. An interfacing apparatus as recited in claim 1 wherein said third and fourth contactors provide for attaching said daughter board to said mother interface board while preserving mechanical access to said mother interface board.

11. An apparatus for interfacing a wafer sort prober apparatus or a packaged IC handler apparatus to a common test computer, said wafer sort prober apparatus for providing electrical connections to a semiconductor wafer, said packaged IC handler apparatus for providing electrical connections to a packaged integrated circuit, and said common test system for controlling test operations performed upon said semiconductor wafer and said packaged integrated circuit, said interfacing apparatus comprising:
   a mother interface board including a computer system interface area, a prober apparatus interface area, and a daughter board interface area, wherein said computer system interface area includes a plurality of contactors for providing electrical connections to said test computer, and wherein said prober apparatus interface area includes a plurality of contactors for providing electrical connections to said wafer sort prober apparatus, and wherein said daughter board interface area includes a plurality of contactors; and
   a daughter board including a plurality of contactors removably mated with said plurality of contactors included with said daughter board interface area of said mother interface board, and including a connector portion to provide electrical connections to said packaged IC handler apparatus.

12. An interfacing apparatus as recited in claim 11 wherein said mother interface board includes a center-located hole that allows visual access to said semiconductor wafer when positioned beneath said mother interface board.

13. An interfacing apparatus as recited in claim 11 wherein an outer periphery of said daughter board extends beyond said prober apparatus interface area such that said prober apparatus interface area is covered when said daughter board is connected to said mother interface board.

14. An interfacing apparatus as recited in claim 11 wherein said plurality of contactors of said daughter board interface area are female receptacles and wherein said plurality of contactors of said daughter board are male connecting pins that mate with said female receptacles.

15. An interfacing apparatus as recited in claim 11 wherein said mother interface board includes a printed circuit board having a plurality of contact pads that form said plurality of contactors of said computer system interface area and said plurality of contactors of said prober apparatus interface area.

16. An interfacing apparatus as recited in claim 15 wherein said plurality of contactors of said computer system interface area are on a first side of said printed circuit board and wherein said plurality of contactors of said prober apparatus interface area are on a second side of said printed circuit board.

17. An interfacing apparatus as recited in claim 16 wherein said plurality of contactors of said daughter board interface area are on said second side of said printed circuit board.

18. An interfacing apparatus as recited in claim 11 wherein said mother interface board includes a plurality of electronic components to support an electrical test of semiconductor wafers and of packaged integrated circuits.

19. An interfacing apparatus as recited in claim 10 wherein said plurality of contactors of said daughter board interface area and said plurality of contactors of said daughter board provide for attaching said daughter board to said mother interface board independent of said wafer sort prober apparatus 20. An interfacing apparatus as recited in claim 11 wherein said plurality of female receptacles and said plurality of male pins provide for attaching said daughter board to said mother interface board while preserving mechanical access to said mother interface board.

21. An apparatus for interfacing a wafer sort prober apparatus or a packaged IC handler apparatus to a common test computer, said wafer sort prober apparatus for providing electrical connections to a semiconductor wafer, said packaged IC handler apparatus for providing electrical connections to a packaged integrated circuit, and said common test computer for controlling test operations performed upon said semiconductor wafer and said packaged integrated circuit, said interfacing system comprising:
- a mother interface board including a computer system interface area, a prober apparatus interface area, and a daughter board interface area, wherein said computer system interface area includes a plurality of contact pads for providing electrical connections to said test computer, wherein said prober apparatus interface area includes a plurality of contact pads for providing electrical connections to said wafer sort prober apparatus, wherein said daughter board interface area includes a plurality of female receptacles, and wherein said mother interface board includes an open hole positioned at a center portion of said mother interface board; and
- a daughter board including a plurality of male pins removably mated with said plurality of female receptacles included with said daughter board interface area of said mother interface board, and including a connector portion that mates with said packaged IC handler apparatus.

22. An apparatus for interfacing a packaged IC handler apparatus to a test head of a test system, said interfacing system comprising:
- a mother interface board having a plurality of first contactors to electrically contact said test head, a plurality of second contactors, and interface circuitry coupled between said first and second contactors;
- an IC contactor attached to said IC handler apparatus and having a plurality of third contactors; and
- a daughter board having a plurality of fourth contactors and a plurality of fifth contactors, said fourth contactors removably contacting said second contactors and said fifth contactors contacting said third contactors.

23. An interfacing apparatus as in claim 22, wherein said second contactors are female receptacles and said fourth contactors are male pins removably mated with said female receptacles.

24. An apparatus for interfacing a probe card and a packaged IC contactor unit to a common test system at different times, said common test system having a test head with a plurality of first contact pins, said apparatus comprising:
- a mother interface board having:
    - a plurality of first contact pads to contact said first contact pins and thereby electrically couple said mother interface board to said test head;
    - a plurality of second contact pads;
    - a plurality of first female receptacles; and
    - an interior edge defining an open hole positioned at the center thereof; and
- an integrated circuit test unit removably coupled to said mother interface board, said integrated circuit test unit being one of a probe card and a packaged IC test unit, said probe card including a plurality of second contact pins, and said packaged IC test unit including:
    - a daughter board having a plurality of second female receptacles and a plurality of first male pins; and
    - an IC contactor having a plurality of second male pins removably mated with said second female receptacles to electrically couple and mechanically attach said IC contactor to said daughter board;
wherein said second contact pads are contacted by said second contact pins when a wafer probe card is being interfaced, and wherein said first male pins are removably mated with said first female receptacles when a packaged IC test unit is being interfaced.

25. An interfacing apparatus as in claim 24 wherein said IC contactor is an IC contactor for dual in-line packages.

26. An interfacing apparatus as in claim 24 wherein said IC contactor is an IC contactor for plastic leaded chip carrier packages.

27. A common interface board for interfacing a probe card or a packaged IC contactor to a common test system, wherein said common test system includes a test computer and a test head with a plurality of first contactors that provide electrical coupling to said test computer, and wherein said probe card has a plurality of second contactors that provide electrical coupling to said common interface board, said common interface board comprising:
- a test head interface area on a first side of said common interface board, said test head interface area having a plurality of third contactors to contact said first contactors on said test head;
- a probe card interface area on a second side of said common interface board, said probe card interface area having a plurality of fourth contactors to contact said second contactors on said probe card;
- a daughter board interface area on said second side of said common interface board, said daughter board interface area having a plurality of fifth contactors;
- a plurality of electronic components coupling said third contactors to said fourth and said fifth contactors, wherein said electronic components are interconnected to form interface circuitry specific to a particular integrated circuit under test, the integrated circuit under test being one of die on a semiconductor wafer and a packaged chip; and
- an open hole that allows visual access to the semiconductor wafer when a wafer is positioned beneath said common interface board.

28. A common interface board as in claim 27 wherein said first contactors are contact pins and said third contactors are contact pads.

29. A common interface board as in claim 27 wherein said second contactors are contact pins and said fourth contactors are contact pads.

30. A common interface board as in claim 27 combined with a daughter board, said daughter board having a plurality of sixth contactors removably connected to said fifth contactors, and having a plurality of seventh contactors for electrically contacting said packaged IC contactor.

31. A method of using a common test system to test a device under test selected from a variety of integrated circuit devices, including integrated circuit dies and packaged integrated circuits, comprising:

electrically coupling first terminals of interface circuitry on a mother interface board to the test system;

selecting a contactor for the device under test, the contactor being a probe card when the device under test is an integrated circuit die, and the contactor being a packaged IC contactor when the device under test is a packaged integrated circuit;

electrically coupling second terminals of the interface circuitry on the mother interface board to the probe card when the device under test is an integrated circuit die on a wafer;

electrically coupling the second terminals of the interface circuitry on the mother interface board to a daughter board when the device under test is a packaged integrated circuit; and electrically coupling the daughter board to the packaged IC contactor when the device under test is a packaged integrated circuit.

32. A method as in claim 31 wherein said step of coupling the second terminals of the interface circuitry on the mother interface board to the daughter board is performed with male pins and female receptacles.

\* \* \* \* \*

UNITED STATES PATENT AND TRADEMARK OFFICE
CERTIFICATE OF CORRECTION

PATENT NO. : 5,489,852
DATED : February 6, 1996
INVENTOR(S) : Carlos A. Gomez

It is certified that error appears in the above-indentified patent and that said Letters Patent is hereby corrected as shown below:

Column 4, line 40, delete "unit"

Column 4, lines 66-67, delete "contactor units" and insert --IC contactors--

Column 8, line 24, delete "the"

Column 8, line 31, after "daughter" insert --board 120--

Column 8, line 50, delete "unit"

Column 11, line 56, after "contactor" insert --mechanically--

Signed and Sealed this

Seventeenth Day of September, 1996

Attest:

BRUCE LEHMAN

*Attesting Officer*    *Commissioner of Patents and Trademarks*